US009472499B2

(12) United States Patent
Chang et al.

(10) Patent No.: US 9,472,499 B2
(45) Date of Patent: Oct. 18, 2016

(54) SELF-ALIGNED PITCH SPLIT FOR UNIDIRECTIONAL METAL WIRING

(71) Applicant: International Business Machines Corporation, Armonk, NY (US)

(72) Inventors: Josephine B. Chang, Mahopac, NY (US); Michael A. Guillorn, Yorktown Heights, NY (US); Eric A. Joseph, White Plains, NY (US); Hiroyuki Miyazoe, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/972,178

(22) Filed: Aug. 21, 2013

(65) Prior Publication Data

US 2014/0252629 A1    Sep. 11, 2014

Related U.S. Application Data

(63) Continuation of application No. 13/793,859, filed on Mar. 11, 2013.

(51) Int. Cl.
*H01L 23/528* (2006.01)
*H01L 23/532* (2006.01)
(Continued)

(52) U.S. Cl.
CPC ....... *H01L 23/528* (2013.01); *H01L 21/76816* (2013.01); *H01L 21/76832* (2013.01); *H01L 21/76834* (2013.01); *H01L 21/76841* (2013.01); *H01L 21/76885* (2013.01);
(Continued)

(58) Field of Classification Search
CPC ........... H01L 23/528; H01L 21/76816; H01L 23/53238; H01L 23/48; H01L 21/76832; H01L 21/76834; H01L 21/76885; H01L 21/76841; H01L 21/76852
USPC ......................................................... 257/761
See application file for complete search history.

(56) References Cited

U.S. PATENT DOCUMENTS

| 7,037,994 B2 | 5/2006 | Sugita et al. |
| 7,244,549 B2 | 7/2007 | Iwasawa et al. |
| 7,303,855 B2 | 12/2007 | Hatakeyama et al. |

(Continued)

OTHER PUBLICATIONS

"Two-Level BEOL Processing for Rapid Iteration in MRAM Development", IBM J. Res. & Dev., vol. 50, No. 1, Jan. 2006.*

(Continued)

*Primary Examiner* — Bilkis Jahan
*Assistant Examiner* — Nga Doan
(74) *Attorney, Agent, or Firm* — Louis J. Percello; Michael J. Chang, LLC

(57) ABSTRACT

Self-aligned pitch split techniques for metal wiring involving a hybrid (subtractive patterning/damascene) metallization approach are provided. In one aspect, a method for forming a metal wiring layer on a wafer includes the following steps. A copper layer is formed on the wafer. A patterned hardmask is formed on the copper layer. The copper layer is subtractively patterned using the patterned hardmask to form a plurality of first copper lines. Spacers are formed on opposite sides of the first copper lines. A planarizing dielectric material is deposited onto the wafer, filling spaces between the first copper lines. One or more trenches are etched in the planarizing dielectric material. The trenches are filled with copper to form a plurality of second copper lines that are self-aligned with the first copper lines. An electronic device is also provided.

12 Claims, 9 Drawing Sheets

(51) Int. Cl.
*H01L 21/768* (2006.01)
*H01L 23/48* (2006.01)

(52) U.S. Cl.
CPC ........ *H01L 23/48* (2013.01); *H01L 23/53238* (2013.01); *H01L 21/76852* (2013.01); *H01L 2924/0002* (2013.01)

(56) References Cited

U.S. PATENT DOCUMENTS

| | | | |
|---|---|---|---|
| 7,358,025 B2 | 4/2008 | Hatakeyama | |
| 2007/0093050 A1* | 4/2007 | Son et al. ...................... | 438/618 |
| 2007/0259516 A1* | 11/2007 | Jahnes ................ | H01L 21/7682 438/618 |
| 2008/0121960 A1* | 5/2008 | Ohuchi ............. | H01L 27/10855 257/296 |
| 2009/0191703 A1* | 7/2009 | Lu ..................... | H01L 21/02063 438/637 |
| 2011/0037105 A1* | 2/2011 | Chang ................ | H01L 21/28079 257/288 |
| 2011/0272765 A1* | 11/2011 | Seo ........................ | H01L 23/485 257/410 |
| 2012/0001299 A1* | 1/2012 | Plum ............................ | 257/532 |
| 2012/0080793 A1* | 4/2012 | Danek ............... | H01L 21/28562 257/751 |
| 2012/0104505 A1* | 5/2012 | Henson ............. | H01L 21/31111 257/369 |
| 2013/0069220 A1* | 3/2013 | Doebler ............ | H01L 21/31144 257/734 |
| 2013/0175634 A1* | 7/2013 | Henson ........................ | 257/369 |
| 2014/0239363 A1* | 8/2014 | Pan ..................... | H01L 27/0629 257/306 |

OTHER PUBLICATIONS

"Fully Integrated 64Kb MRAM with Novel Reference Cell Scheme", 2002 IEEE.*

* cited by examiner

SELF-ALIGNED PITCH SPLIT FOR UNIDIRECTIONAL METAL WIRING

CROSS-REFERENCE TO RELATED APPLICATION(S)

This application is a continuation of U.S. application Ser. No. 13/793,859 filed on Mar. 11, 2013, the disclosure of which is incorporated by reference herein.

FIELD OF THE INVENTION

The present invention relates to pitch split lithography techniques and more particularly, to self-aligned pitch split techniques for metal wiring involving a hybrid (subtractive patterning/damascene) metallization approach.

BACKGROUND OF THE INVENTION

For technology nodes beyond the 14 nanometer (nm) node the scaling roadmap dictates minimum wiring pitch which is smaller than that which can be printed with lithography techniques which are currently manufacturable, i.e., immersion 193 nm lithography. As advanced lithography techniques such as electron beam (e-beam), extreme UV, or directed self-assembly are not ready for manufacturing, the industry has resorted to so called "pitch split" techniques.

One pitch split technique is sidewall image transfer (SIT), in which mandrel shapes are printed at double the target pitch, and each sidewall of the mandrel shapes is converted into a shape in the target material through a series of processes typically involving sidewall spacer formation. A disadvantage of using SIT processes is that many pattern constructs can not be drawn directly (for example, an odd number of lines, or two parallel lines which do not connect), necessitating a trim process to remove unwanted features. Trimming away features at tight pitch without removing desired features is extremely challenging, requiring excellent overlay tolerance of the trim mask to the SIT patterns, as well as excellent control over the dimension of the mandrel, which controls the exact placement of the SIT patterns.

An alternate pitch split technique involves interleaved exposures, in which the final target pattern is a union of shapes on multiple masks which are not self-aligned. Overlay between the separate exposures then becomes important, as the spacing between adjacent lines at the tightest pitch is directly related to registration between separate lithographic exposures. In practice, controlling the overlay is difficult.

Therefore improved pitch split lithography techniques would be desirable.

SUMMARY OF THE INVENTION

The present invention provides self-aligned pitch split techniques for metal wiring involving a hybrid (subtractive patterning/damascene) metallization approach. In one aspect of the invention, a method for forming a metal wiring layer on a wafer is provided. The method includes the following steps. A copper layer is formed on the wafer. A patterned hardmask is formed on the copper layer. The copper layer is subtractively patterned using the patterned hardmask to form a plurality of first copper lines, wherein the subtractively patterning step is a first exposure of the wafer. Spacers are formed on opposite sides of the first copper lines. A planarizing dielectric material is deposited onto the wafer, filling spaces between the first copper lines. One or more trenches are etched in the planarizing dielectric material, wherein the etching step is a second exposure of the wafer. The trenches are filled with copper to form a plurality of second copper lines that are self-aligned with the first copper lines.

In another aspect of the invention, an electronic device is provided. The electronic device includes a metal wiring layer on a wafer. The metal wiring layer includes a plurality of subtractively patterned first copper lines on a wafer; spacers on opposite sides of the first copper lines; a planarizing dielectric material on the wafer and filling spaces between the first copper lines; and a plurality of damascene patterned second copper lines formed in trenches in the dielectric material, wherein the second copper lines are self-aligned with the first copper lines.

A more complete understanding of the present invention, as well as further features and advantages of the present invention, will be obtained by reference to the following detailed description and drawings.

DETAILED DESCRIPTION OF PREFERRED EMBODIMENTS

Provided herein are pitch split lithography techniques in which metal wiring at sublithographic pitch (beyond the 14 nanometer (nm) node—see above) is achieved using a hybrid metallization approach. Specifically, a first set of metal wiring is subtractively patterned, and then a second set of metal wiring is patterned using a damascene process which is self-aligned to the first set of wires in regions of minimum pitch. This subtractively patterned/damascene process is what is being referred to herein as a hybrid metallization approach. It is notable that while the present description illustrates embodiments that involve patterning of unidirectional metal wiring, this is merely one exemplary implementation of the present techniques. The process described herein may be applied to scenarios involving arbitrary wiring orientation.

Figure 1:
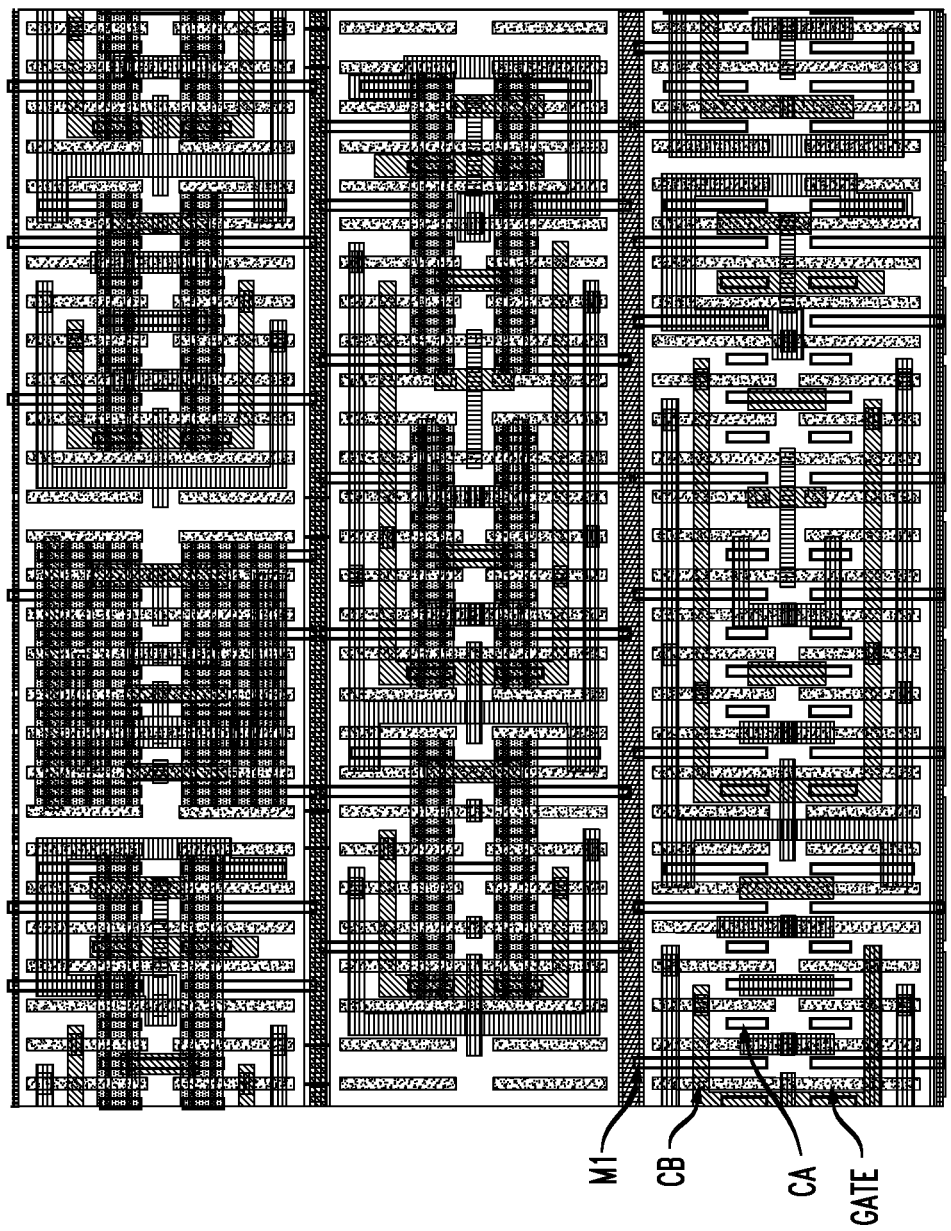
FIG. 1 is a top down view diagram illustrating a first layer of wiring (M1) in an exemplary electronic device circuit layout according to an embodiment of the present invention.
Figure 2:
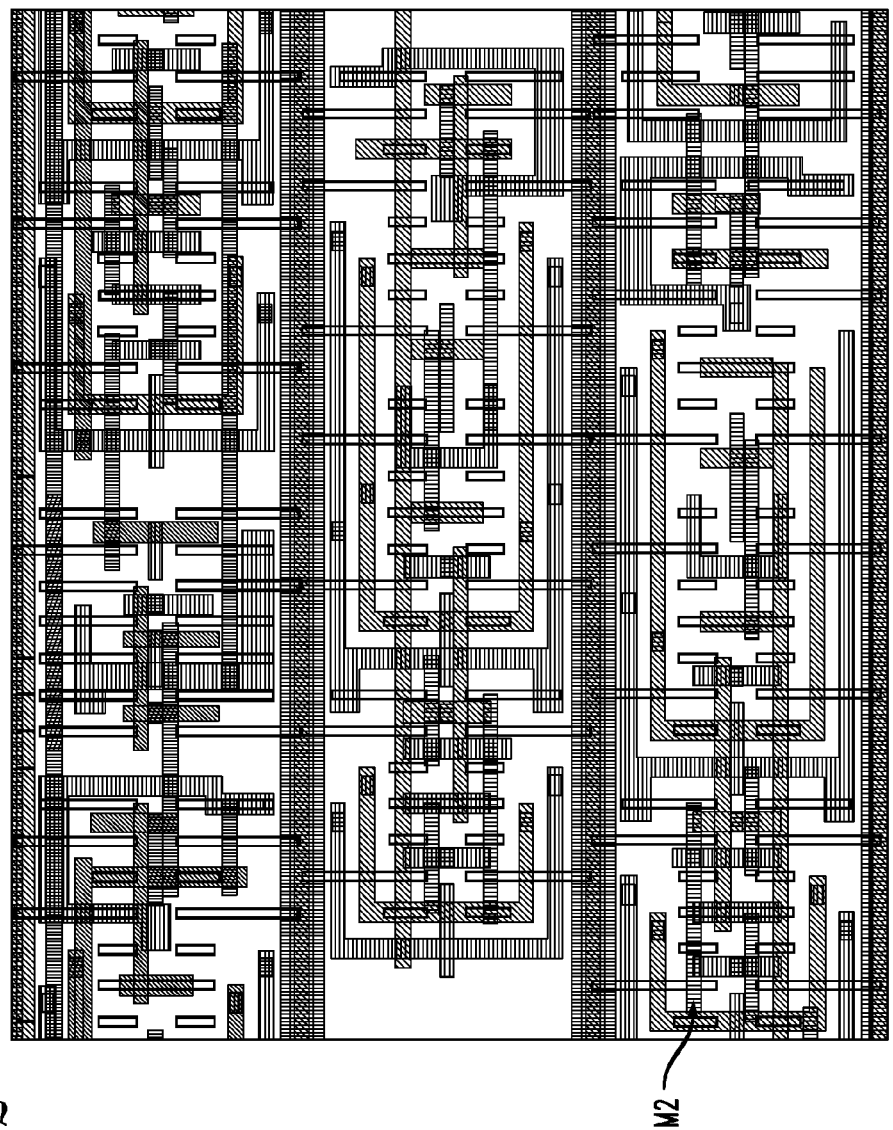
FIG. 2 is a top down view diagram illustrating a second exemplary layer of wiring (M2) having been formed over the electronic device circuit layer of FIG. 1 according to an embodiment of the present invention.
Figure 3:
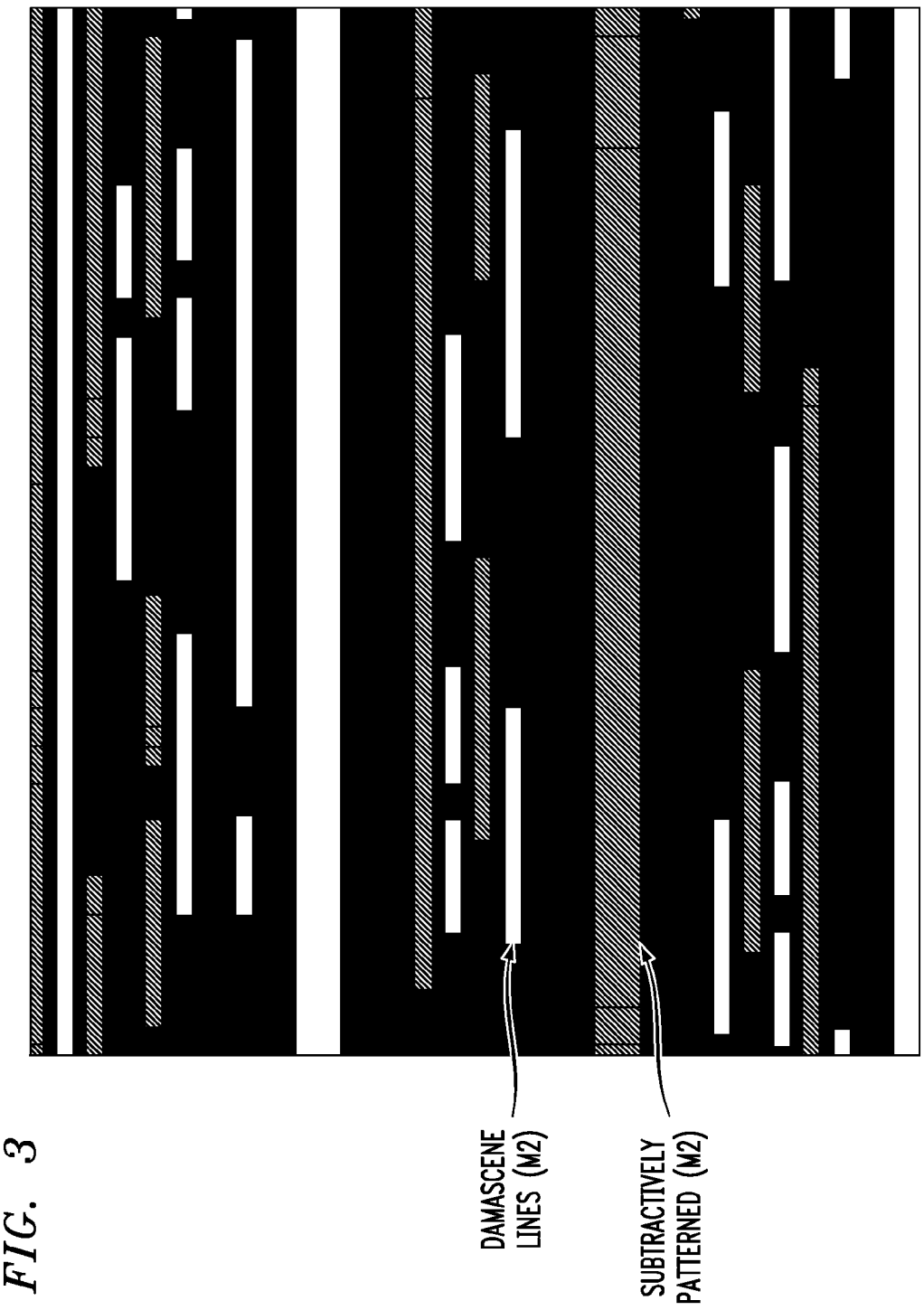
FIG. 3 is a top down view diagram illustrating the present hybrid metallization approach in the context of fabricating the M2 metal wiring of FIG. 2 wherein only the subtractively patterned and damascene patterned (M2) metal wires are shown according to an embodiment of the present invention.

An overview of the present techniques is now provided by way of reference to FIGS. 1-3. In the example shown in FIGS. 1-3, the present techniques are employed to pattern unidirectional metal wiring for a second layer of wiring (M2) in a device circuit layout. Again this is only an example.

In FIG. 1, an exemplary first layer of wiring (M1) is shown. The layout of FIG. 1 contains a plurality of transistors. Each transistor includes a source region and a drain region interconnected by a channel. A gate regulates electron flow through the channel. Standard microfabrication techniques such as lithography, etching, and damascene techniques well known in the art may be employed to form source/drain region contacts (CA), gate contacts (CB), and M1 metal lines.

The focus of the present techniques in this example will be in fabricating (unidirectional) M2 metal lines. Namely, as shown in FIG. 2 a second layer of wiring (M2) has been formed over the circuit layer illustrated in FIG. 1. In this example, the present hybrid metallization approach has been implemented to form the (self-aligned) M2 metal lines shown.

FIG. 3 further illustrates the present hybrid metallization approach for fabricating the M2 metal wiring in this example. For clarity of description, only the (unidirectional) M2 metal wires are shown in FIG. 3. As highlighted above, and as will be described in detail below, the present process involves a hybrid metallization process, wherein a first exposure involves a subtractive patterning process. The subtractively patterned M2 metal wires are shown in FIG. 3 as shaded boxes. The second exposure involves a damascene metallization process. The damascene (M2) metal wires are shown in FIG. 3 as solid boxes.

Given the above-described overview of the process, an exemplary hybrid metallization methodology according to the present techniques is now described by way of reference to FIGS. 4-13. As described above, in the instant example the present techniques are being employed to fabricate a (second) M2 wiring layer on top of a (first) M1 wiring layer. It is thus assumed here that the M1 metal layer (and any underlying layers of the layout) have been fabricated using standard techniques. See, for example, FIG. 1, described above. For ease and clarity of description, these (M1 and underlying) layers are not shown in FIGS. 4-13.

To form the M2 wire layer on the M1 wire layer, a dielectric layer 402 is formed on the M1 wiring layer. See FIG. 4. Standard lithography, etching, metallization, and planarization processes are used to form contacts 404 in the dielectric layer 402. If a rough topography is present, the surface of the dielectric layer 402 may be planarized using a process such as chemical-mechanical process. It is preferable that the starting platform for the present metallization process is a planar surface.

Figure 4:
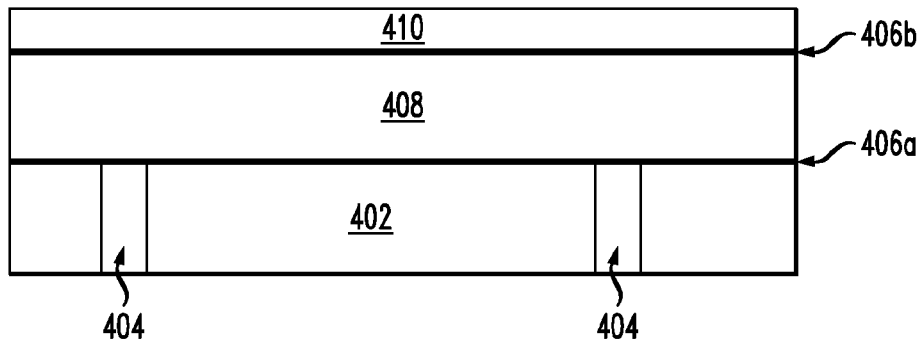
FIG. 4 is a cross-sectional diagram illustrating an exemplary implementation of the present hybrid metallization techniques for forming an M2 metal wiring layer wherein a copper layer is formed on the planarized M1 dielectric layer, followed by an (optional) liner, and a hardmask layer according to an embodiment of the present invention.

Next, as shown in FIG. 4, an optional liner 406a may be deposited onto the dielectric layer 402/contacts 404. Liner 406a acts as an oxygen and metals diffusion barrier and serves to promote adhesion of the subsequently-deposited layer(s). Suitable liner materials include, but are not limited to, titanium (Ti), tantalum (Ta), titanium nitride (TiN), tantalum nitride (TaN) and combinations including at least one of the foregoing materials. The liner 406a may be deposited using a process such as chemical vapor deposition (CVD) or atomic layer deposition (ALD) to a thickness of from about 0.5 nanometers (nm) to about 3 nm.

Copper is then deposited onto the dielectric layer 402/contacts 404 (or onto optional liner 406a if present) to form copper layer 408. The copper may be deposited using a process such as evaporation, sputtering, or electroplating. An optional liner 406b may be deposited onto the copper layer 408. As described above, the liner 406b acts as an oxygen and metal diffusion barrier and serves to promote adhesion of the subsequently-deposited layer(s). Suitable liner materials, layer thicknesses, etc. were provided above.

Next, a hardmask layer 410 is formed on the copper layer 408 (or on the optional liner 406b if present). Suitable hardmask materials include, but are not limited to, nitride materials, such as silicon nitride (SiN). Standard patterning techniques are then used to pattern the hardmask layer 410 with the footprint and location of the (first exposure) M2 metal wires in the copper layer 408 which will be performed using subtractive patterning. Subtractive patterning is described generally in U.S. Patent Application Publication Number 2012/0080793 filed by Danek et al., entitled "Subtractive Patterning to Define Circuit Components," the entire contents of which are incorporated by reference herein.

Figure 5:
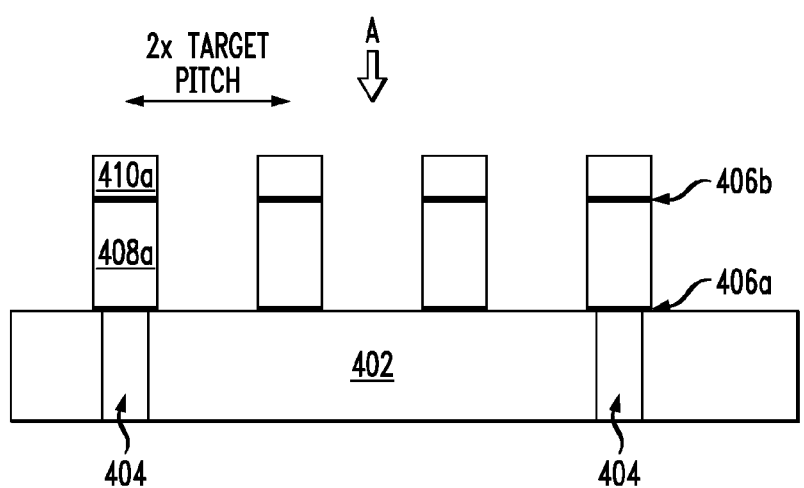
FIG. 5 is a cross-sectional diagram illustrating the hardmask (now patterned) having been used to (subtractively) pattern the copper layer to form a plurality of copper lines at a 2× target pitch according to an embodiment of the present invention.

Namely, as shown in FIG. 5, during a first exposure of the M2 wire layer subtractive patterning of the copper layer 408 is performed using the patterned hardmask layer 410 as a mask to form a plurality of copper lines 408a. The patterned hardmask is hereinafter given reference numeral 410a. According to an exemplary embodiment, the copper layer is patterned using an anisotropic etching process, such as reactive ion etching (RIE). As shown in FIG. 5, the target for this subtractive patterning step is a 2× pitch for the copper lines 408a. The term "pitch" as used herein refers to a distance from a given point on one of the copper lines 408a to the same point on an adjacent line. The 2× target pitch reflects the fact that the present techniques employ a pitch split technique and a hybrid metallization approach. Thus, the pitch employed in the instant subtractive patterning step combined with that of the subsequent damascene patterning step will result in the desired final pitch of the M2 wiring.

Figure 5A:
FIG. 5A is a top down view of the structure of FIG. 5 wherein the subtractively patterned M2 metal wires are shown as shaded boxes according to an embodiment of the present invention.
Figure 6:
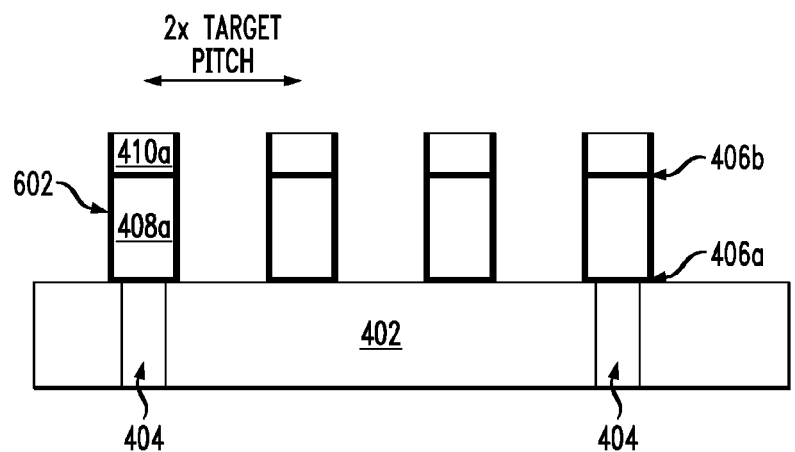
FIG. 6 is a cross-sectional diagram illustrating an (optional) liner having been formed on the sidewalls of the copper lines according to an embodiment of the present invention.

FIG. 5A is a top down view of the structure of FIG. 5 (i.e., from vantage point A) illustrating the (subtractively patterned) copper lines 408a. Using the same convention as in FIG. 3, the subtractively patterned (M2) lines are shown with shaded boxes.

Optionally, a liner 602 may then be formed on the sidewalls of the copper lines 408a. As with liner 406a/406b above, liner 602 acts as a diffusion barrier and may be formed from materials including, but not limited to, Ti, Ta, TiN, TaN and combinations including at least one of the foregoing materials deposited using a process such as CVD or ALD. The liner 602 can be formed by depositing the liner material onto the structure, and then removing the excess material using an isotropic etching process. The liner material will be removed from all horizontal surfaces. The result is liner 602 present on the sidewalls of the copper lines 408a. According to an exemplary embodiment, the liner 602 is formed to a thickness of from about 0.5 nm to about 3 nm on the sidewalls of the copper lines 408a.

Spacers 702 are then formed on opposite sides of the copper lines 408a (e.g., over the optional liner 602). According to an exemplary embodiment, spacers 702 are formed from a low-κ dielectric material, such as SiCOH. The term "low-κ" as used herein refers to a material having a dielectric constant that is less than the dielectric constant of silicon dioxide (which is 3.9). Suitable low-κ materials include, but are not limited to, SiCOH, fluorinated amorphous carbon, silsesquioxane compounds, and combinations including at least one of the foregoing low-κ materials. The use of a low-κ material for forming spacers 702 is desirable for lowering parasitic capacitances. By way of example only, the spacers 702 may be formed on opposite sides of the copper lines 408a by first depositing the spacer material onto the structure, and then using conventional lithography and etching techniques to pattern the material into spacers 702. Accordingly, the spacer material will be removed from the horizontal surfaces leaving spacers 702 on the sidewalls of the copper lines 408a. See also FIG. 7A.

Figure 7:
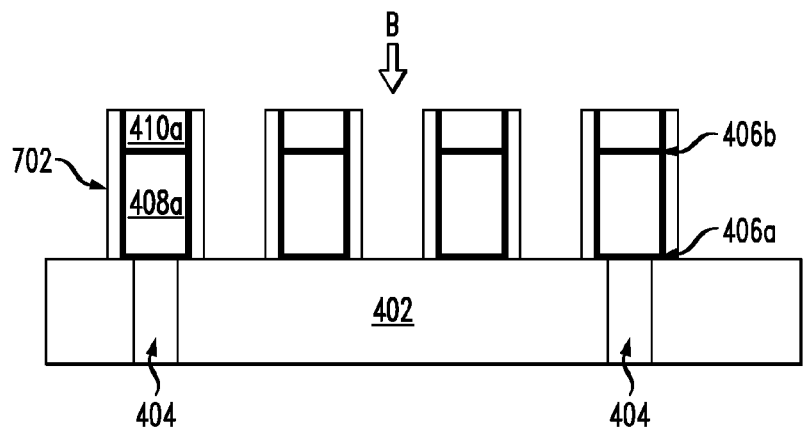
FIG. 7 is a cross-sectional diagram illustrating spacers having been formed on opposite sides of the copper lines, e.g., over the optional liner according to an embodiment of the present invention.
Figure 7A:
FIG. 7A is a top down view of the structure of FIG. 7 illustrating the spacers having been formed on the sidewalls of the copper lines according to an embodiment of the present invention.
Figure 8:
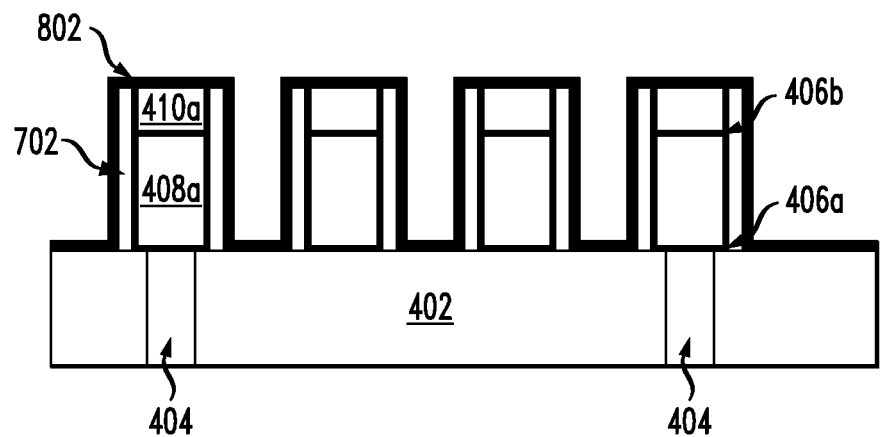
FIG. 8 is a cross-sectional diagram illustrating an optional etch stop liner having been deposited onto the structure covering the sidewall spacers according to an embodiment of the present invention.
Figure 9:
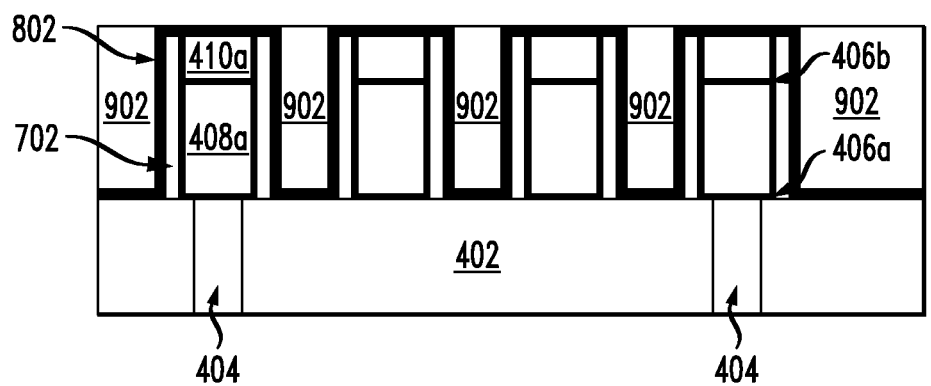
FIG. 9 is a cross-sectional diagram illustrating a planarizing dielectric material having been deposited onto the wafer, filling the spaces between the (subtractively patterned) copper lines according to an embodiment of the present invention.

FIG. 7A is a top down view of the structure of FIG. 7 (i.e., from vantage point B) illustrating the spacers 702 having been formed on the sidewalls of the copper lines 408a. Using the same convention as in FIG. 3, the subtractively patterned (M2) lines are shown with shaded boxes.

While, as highlighted above, it is desirable to use a low-κ material for the sidewall spacers 702, low-κ dielectric materials erode easily during etching. Thus, to protect the sidewall spacers 702 during the subsequent damascene patterning step (see below), an etch stop liner 802 is optionally deposited onto the structure covering the sidewall spacers 702. See FIG. 8. According to an exemplary embodiment, the etch stop liner 802 is formed from a highly etch resistant material, such as but not limited to, hafnium oxide ($HfO_2$), aluminum oxide ($Al_2O_3$), and combinations including at least one of the foregoing materials, deposited onto the wafer using a deposition process such as spin coating to a thickness of from about 0.5 nm to about 3 nm.

A planarizing dielectric material 902 is then deposited onto the wafer, filling the spaces between the (subtractively patterned) copper lines 408a. See FIG. 9. According to an exemplary embodiment, the dielectric material 902 is an organic material. Suitable organic dielectric materials include, but are not limited to, aromatic cross-linkable polymers (e.g., naphthalene-based) in a solvent that may be spin-coated onto the substrate. Spin-coating ensures that the dielectric material 902 sufficiently fills the spaces between the copper lines 408a.

Other suitable organic materials for use as the dielectric material 902 include but are not limited to those materials described in U.S. Pat. No. 7,037,994 issued to Sugita et al. entitled "Acenaphthylene Derivative, Polymer, and Antireflection Film-Forming Composition," U.S. Pat. No. 7,244,549 issued to Iwasawa et al. entitled "Pattern Forming Method and Bilayer Film," U.S. Pat. No. 7,303,855 issued to Hatakeyama et al. entitled "Photoresist Undercoat-Forming Material and Patterning Process" and U.S. Pat. No. 7,358,025 issued to Hatakeyama entitled "Photoresist Undercoat-Forming Material and Patterning Process." The contents of each of the foregoing patents are incorporated by reference herein. A post-apply bake is then performed to cross-link the organic dielectric material 902 and bake off the solvent. According to an exemplary embodiment, the post-apply bake is conducted at a temperature of up to about 250 degrees Celsius (° C.), e.g., from about 200° C. to about 250° C.

The dielectric material 902, once deposited, may be planarized using a process such as chemical mechanical polishing (CMP). Accordingly, the substrate for the second exposure, the damascene patterning step, has a planar surface. To begin the damascene process, i.e., the second M2 exposure process, a patterned resist 1002 is formed on the wafer over the dielectric material 902. See FIG. 10. Standard lithography and etching techniques may be used to form the patterned resist 1002. It is notable however that care must be taken to prevent erosion of the sidewall spacers 702 during this resist patterning process. As highlighted above, the sidewall spacers 702 are preferably formed from a low-k dielectric material which is prone to erosion during etching. Thus, the optional etch stop liner 802 is helpful in that regard. As will become apparent from the description that follows, preventing erosion of the sidewall spacers 702 is important to prevent unwanted shorting of the damascene patterned copper (to be deposited as described below) with the (subtractively patterned) copper lines 408a.

Figure 10:
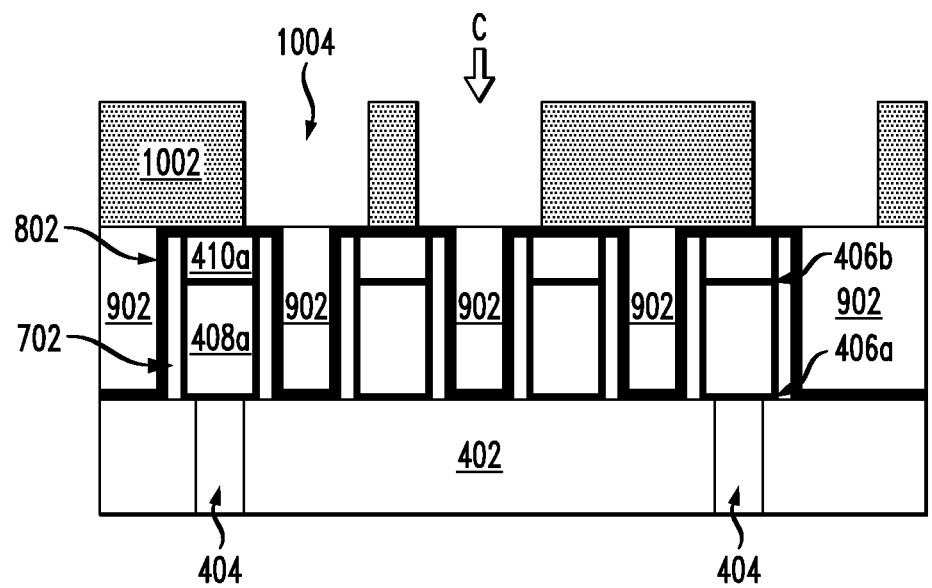
FIG. 10 is a cross-sectional diagram illustrating a patterned resist having been formed on the wafer to begin a damascene metallization process according to an embodiment of the present invention.

Further, as compared to conventional pitch split techniques, the overlay of the wire pattern 1004 in resist 1002 on the underlying layer does not have to be tightly controlled. For instance, as shown in FIG. 10, the wire pattern 1004 in resist 1002 does not have to be precisely aligned to the underlying layer. In fact, in the example shown, the wire pattern 1004 is wider than the underlying trench. Therefore, in regions of dense lines at target pitch, the final profile of the damascene patterned lines will be defined not by the resist 1002, but rather by the sidewalls of the neighboring subtractively patterned lines, thus resulting in a self-aligned pitch splitting pattern.

Figure 10A:
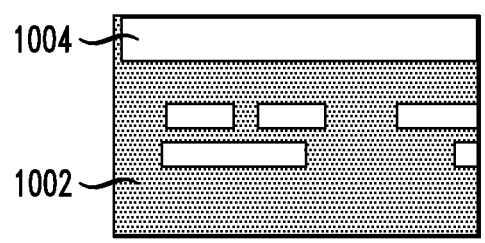
FIG. 10A is a top down view of the structure of FIG. 10 illustrating the patterned resist on the wafer according to an embodiment of the present invention.

FIG. 10A is a top down view of the structure of FIG. 10 (i.e., from vantage point C) illustrating the patterned resist 1002 on the wafer. The wire pattern 1004 in resist 1002 is visible in FIG. 10A.

The patterned resist 1002 is then used to etch trenches 1102 in the dielectric material 902. See FIG. 11. According to an exemplary embodiment, a RIE process is used to pattern the trenches 1102. In the example shown in FIG. 11, the trenches 1102 are being formed in between two of the (subtractively patterned) copper lines 408a. This is not however necessary. The second exposure can be used to form (damascene patterned) M2 metal wires anywhere on the wafer (see, for example, FIG. 11A).

Figure 11:
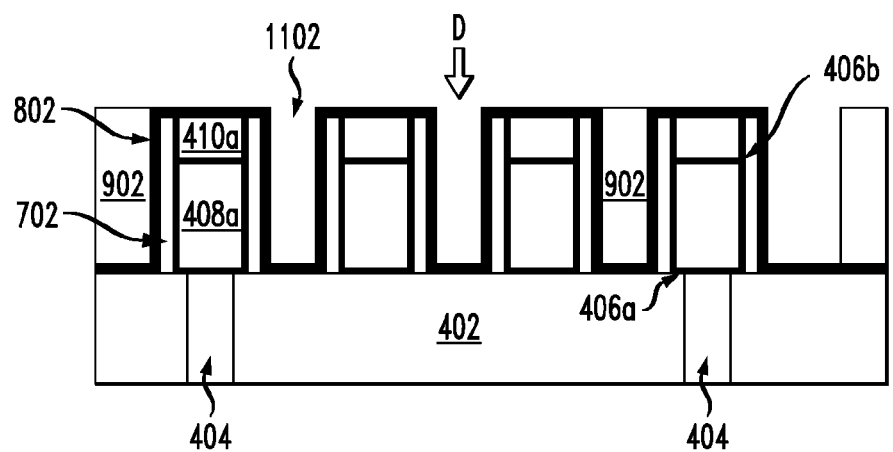
FIG. 11 is a cross-sectional diagram illustrating the patterned resist having been used to etch trenches in the dielectric material and the patterned resist having been removed according to an embodiment of the present invention.
Figure 11A:
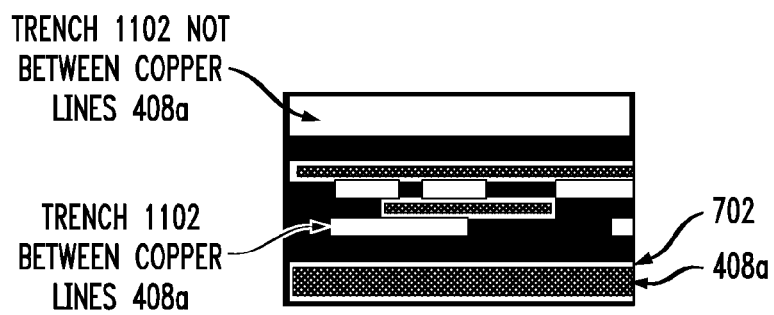
FIG. 11A is a top down view of the structure of FIG. 11 illustrating the trenches having been etched into the wafer according to an embodiment of the present invention.

Following the etch, any remaining resist can be removed, e.g., using a wet etching process. The result of this second exposure step is a plurality of trenches 1102 having been patterned in the wafer. See FIG. 11A which is a top down view of the structure of FIG. 11 (i.e., from vantage point D). With the patterned resist 1002 removed, from this view one can see the trenches 1102 having been patterned in the dielectric material 902. As shown in FIG. 11A, it is important that the sidewall spacers 702 remain intact during this trench etch. As described above, the optional etch stop liner 802 helps in protecting the sidewall spacers 702, especially when the sidewall spacers 702 are formed from a material susceptible to erosion, such as a low-k material.

Copper 1202 is then deposited onto the wafer filling the trenches 1102. See FIG. 12. According to an exemplary embodiment, prior to deposition of the copper, a liner seed layer 1204 is first deposited onto the wafer and lining the trenches 1102. The liner seed layer 1204 promotes adhesion of the copper 1202 to the wafer. According to an exemplary embodiment, the liner seed layer 1204 is formed from a material including, but not limited to, Ti, Ta, TiN, TaN and combinations including at least one of the foregoing materials deposited onto the wafer using a process such as CVD or ALD to a thickness of from about 0.5 nm to about 3 nm.

Figure 12:
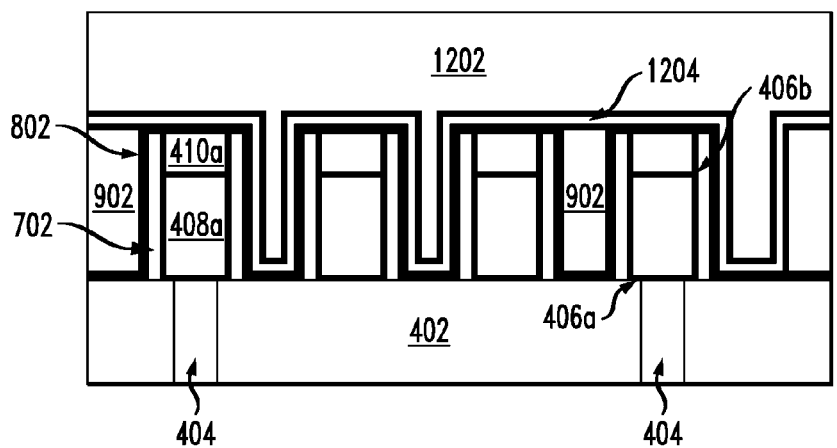
FIG. 12 is a cross-sectional diagram illustrating copper having been deposited onto the wafer filling the trenches according to an embodiment of the present invention.

The copper 1202 may then be deposited onto the wafer by a process such as electroplating, evaporation, or sputtering. As shown in FIG. 12, the copper 1202 fills the trenches 1102. Excess copper 1202 is removed using, e.g., a process such as CMP, to form individual/separate copper lines 1302. See FIG. 13.

Figure 13:
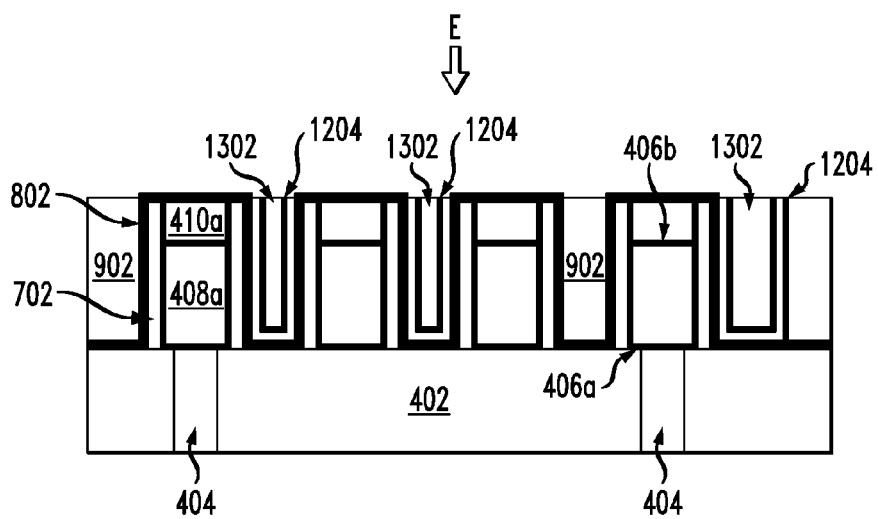
FIG. 13 is a cross-sectional diagram illustrating excess copper having been removed to form individual/separate damascene patterned (M2) metal wires according to an embodiment of the present invention.
Figure 13A:
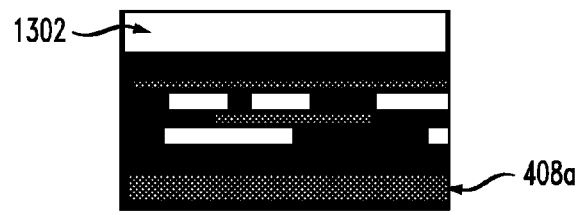
FIG. 13A is a top down view of the structure of FIG. 13 illustrating both subtractively patterned and damascene patterned (M2) metal wires formed using the present process according to an embodiment of the present invention.

FIG. 13A is a top down view of the structure of FIG. 13 (i.e., from vantage point E) illustrating both the previously formed (subtractively patterned) copper lines 408a and the now formed (damascene patterned) copper lines 1302. Using the same convention as in FIG. 3, the subtractively patterned (M2) lines are shown with shaded boxes and the damascene patterned (M2) lines are shown with solid boxes. Any additional processing steps may now be performed including, for example, forming one or more additional metal (MX) layers using the present techniques.

As shown in FIGS. 13 and 13A, by way of the present process the (damascene patterned) copper lines 1302 are self-aligned with the previously formed (subtractively patterned) copper lines 408a. As highlighted above, the copper lines 408a are formed at a 2× target pitch. The self-aligned copper lines 1302 formed between the copper lines 408a then achieve the target pitch for the M2 metal wiring.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An electronic device, comprising:
a circuit layer on a wafer, the circuit layer comprising a plurality of transistors;
a metal wiring layer on the circuit layer, wherein the metal wiring layer comprises:
a plurality of subtractively patterned first copper lines on the circuit layer;
a nitride patterned hardmask on the first copper lines;
spacers on opposite sides of the first copper lines and the patterned hardmask;
an etch stop liner covering the patterned hardmask and the spacers,
a planarizing dielectric material on the circuit layer and filling spaces between the first copper lines; and
a plurality of damascene patterned second copper lines formed in trenches in the dielectric material between the first copper lines so that the first copper lines and the second copper lines are present next to one another in the metal wiring layer, and wherein the second copper lines are self-aligned with the first copper lines.

2. The device of claim 1, wherein the circuit layer comprises a planar layer onto which the metal wiring layer is formed.

3. The device of claim 1, further comprising:
a liner between the first copper lines and the circuit layer, wherein the liner comprises a material selected from the group consisting of: titanium, tantalum, titanium nitride, tantalum nitride and combinations comprising at least one of the foregoing materials.

4. The device of claim 1, further comprising:
a liner between the patterned hardmask and first copper lines, wherein the liner comprises a material selected from the group consisting of: titanium, tantalum, titanium nitride, tantalum nitride and combinations comprising at least one of the foregoing materials.

5. The device of claim 1, further comprising:
a liner between the spacers and the first copper lines, wherein the liner comprises a material selected from the group consisting of: titanium, tantalum, titanium nitride, tantalum nitride and combinations comprising at least one of the foregoing materials.

6. The device of claim 1, wherein the spacers comprise a low-κ material selected from the group consisting of: SiCOH, silsesquioxane compounds, and combinations comprising at least one of the foregoing low-κ materials.

7. The device of claim 1, wherein the etch stop liner comprises a material selected from the group consisting of: hafnium oxide, aluminum oxide, and combinations comprising at least one of the foregoing materials.

8. The device of claim 1, wherein at least one of the second copper lines is present between two of the first copper lines.

9. The device of claim 1, wherein the first copper lines are formed at 2× a target pitch, and wherein the first copper lines in combination with the second copper lines are at the target pitch.

10. The device of claim 1, wherein the etch stop liner has a thickness of from about 0.5 nm to about 3 nm.

11. The device of claim 1, wherein the planarizing dielectric material comprises a cross-linked organic planarizing dielectric material.

12. The device of claim 1, further comprising a liner seed layer lining the trenches in the dielectric material, wherein the liner seed layer comprises a material selected from the group consisting of: titanium, tantalum, titanium nitride, tantalum nitride and combinations comprising at least one of the foregoing materials.

* * * * *